(12) United States Patent
Araki et al.

(10) Patent No.: US 10,483,175 B2
(45) Date of Patent: Nov. 19, 2019

(54) POWER SEMICONDUCTOR DEVICE

(71) Applicant: Mitsubishi Electric Corporation, Tokyo (JP)

(72) Inventors: Shoko Araki, Fukuoka (JP); Yukimasa Hayashida, Tokyo (JP); Ryutaro Date, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 15/758,349

(22) PCT Filed: Dec. 4, 2015

(86) PCT No.: PCT/JP2015/084132
§ 371 (c)(1),
(2) Date: Mar. 8, 2018

(87) PCT Pub. No.: WO2017/094180
PCT Pub. Date: Jun. 8, 2017

(65) Prior Publication Data
US 2018/0261517 A1    Sep. 13, 2018

(51) Int. Cl.
*H01L 23/053*    (2006.01)
*H01L 23/04*    (2006.01)
(Continued)

(52) U.S. Cl.
CPC ............... *H01L 23/04* (2013.01); *H01L 24/00* (2013.01); *H01L 25/07* (2013.01); *H01L 25/18* (2013.01);
(Continued)

(58) Field of Classification Search
CPC ......... H01L 23/04; H01L 24/00; H01L 25/18; H01L 25/07; H01L 2924/10272; H01L 2224/47; H05K 7/06
See application file for complete search history.

(56) References Cited

U.S. PATENT DOCUMENTS 3,491,272 A * 1/1970 Huth ................. H01L 21/00
257/496
6,809,410 B2 * 10/2004 Yamada .................. H01L 23/24
257/502
(Continued)

FOREIGN PATENT DOCUMENTS

JP    2007-184315 A    7/2007

OTHER PUBLICATIONS

International Search Report issued in PCT/JP2015/084132; dated Feb. 23, 2016.

*Primary Examiner* — Hoa B Trinh
(74) *Attorney, Agent, or Firm* — Studebaker & Brackett PC

(57) ABSTRACT

An object of the present invention to provide a technique which can put flexibility into positions, positional relationships, and sizes of constituent elements. A power semiconductor device includes: a substrate on which a semiconductor chip is disposed; an electrode which has one end fixed to the substrate and stands upright on the substrate; and an insulating case which houses the electrode and has a part opposed to the other end of the electrode. The power semiconductor device includes a conductive nut which is inserted into the case in the part of the case and a conductive component which electrically connects the other end of the electrode and the nut.

7 Claims, 3 Drawing Sheets

(51) Int. Cl.
*H01L 25/07* (2006.01)
*H01L 25/18* (2006.01)
*H05K 7/06* (2006.01)
*H01L 23/00* (2006.01)

(52) U.S. Cl.
CPC ............ *H05K 7/06* (2013.01); *H01L 2224/47* (2013.01); *H01L 2924/10272* (2013.01)

(56) References Cited

U.S. PATENT DOCUMENTS

2015/0152258 A1* 6/2015 Tabei .................. C08G 59/245
361/820
2016/0233141 A1* 8/2016 Hirobe ................ H01L 23/3675

* cited by examiner

FIG. 1    -- Related Art --
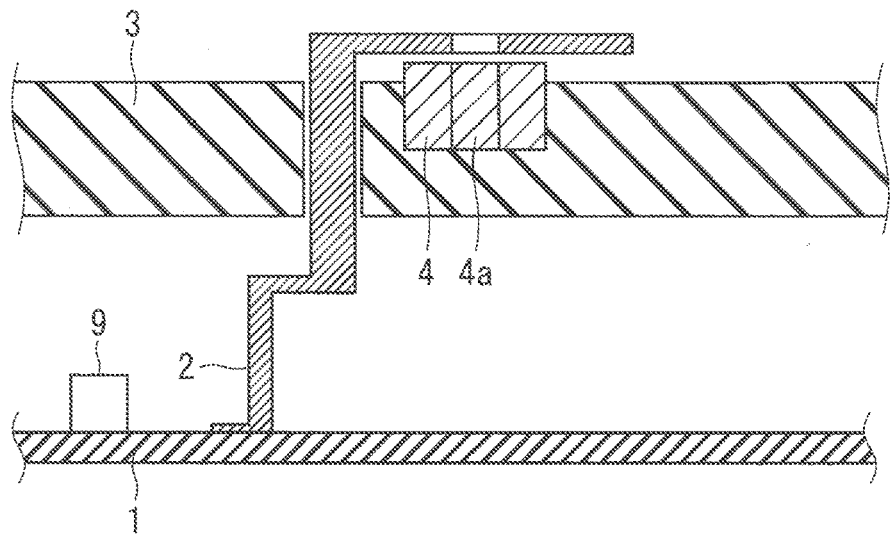
FIG. 2
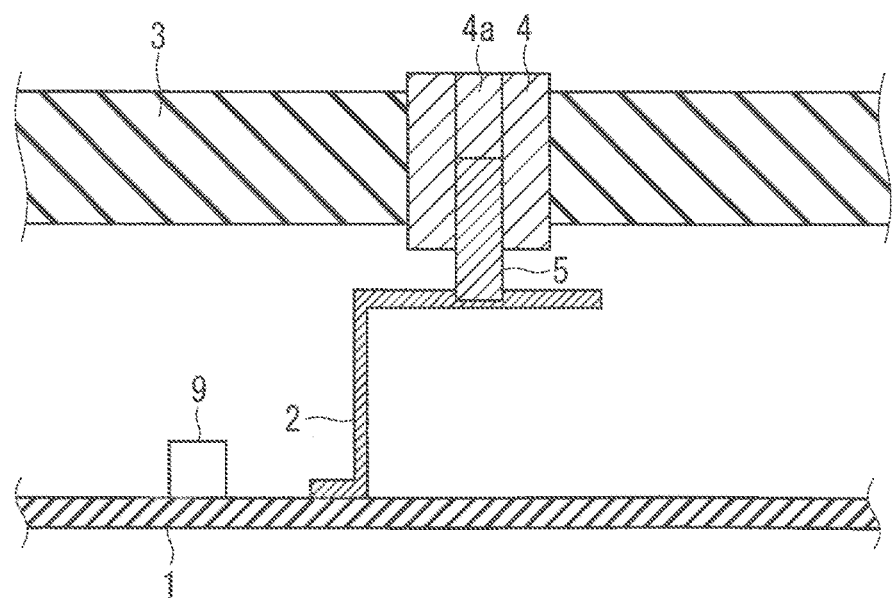

POWER SEMICONDUCTOR DEVICE

TECHNICAL FIELD

The present invention relates to a power semiconductor device including a case.

BACKGROUND ART

Conventionally, a configuration of inserting an electrode made of a plate-like metal into a case is applied to an electrical wiring from a semiconductor chip in an inner side of the case of a power semiconductor device to an outer side of the case (for example, Patent Document 1). Specifically, one end of the electrode is fixed to an inner side of the device by soldering, for example, and the other end of the electrode is folded to be in parallel with an upper surface of the case.

PRIOR ART DOCUMENTS

Patent Documents

Patent Document 1: Japanese Patent Application Laid-Open No. 2007-184315

SUMMARY

Problem to be Solved by the Invention

Since the other end of the electrode located on the upper surface of the case is connected to an external wiring by a bolt, for example, a certain accuracy is required for a position, a positional relationship, and a size of the electrode, for example. As a result, the conventional configuration has a problem that the electrode structure becomes complex, thus a cost for the electrode increases and the electrode is hard to manufacture.

The present invention therefore has been made to solve problems as described above, and it is an object of the present invention to provide a technique which can put flexibility into positions, positional relationships, and sizes of constituent elements.

Means to Solve the Problem

A power semiconductor device according to the present invention includes: a substrate on which a semiconductor chip is disposed; an electrode which has one end fixed to the substrate and stands upright on the substrate; an insulating case which houses the electrode and has a part opposed to the other end of the electrode; a conductive nut which is inserted into the case in the part of the case; and a conductive component which electrically connects the other end of the electrode and the nut.

Effects of the Invention

According to the present invention, the electrode and the nut are electrically connected by the conductive member such as the stud bolt. Flexibility can be put into positions, positional relationships, and sizes of constituent elements.

These and other objects, features, aspects and advantages of the present invention will become more apparent from the following detailed description of the present invention when taken in conjunction with the accompanying drawings.

BRIEF DESCRIPTION OF DRAWINGS

[FIG. 1] A cross-sectional view illustrating a configuration of a related semiconductor device.

[FIG. 2] A cross-sectional view illustrating a configuration of a power semiconductor device according to an embodiment 1.

DESCRIPTION OF EMBODIMENT(S)

Embodiment 1

Figure 3:
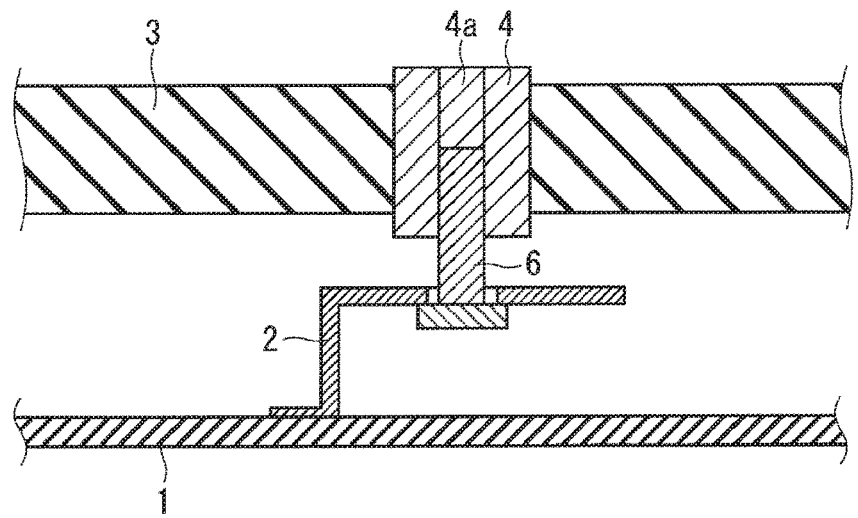
[FIG. 3] A cross-sectional view illustrating a configuration of a power semiconductor device according to an embodiment 2.

Prior to the description of a power semiconductor device according to the embodiment 1 of the present invention, a power semiconductor device relating thereto (referred to as "the related semiconductor device" hereinafter) is described.

FIG. 1 is a cross-sectional view illustrating a configuration of a related semiconductor device. The related semiconductor device includes an insulating substrate 1 which is a substrate with a semiconductor chip 9 thereon, an electrode 2, an insulating case 3, and a nut 4.

In the description hereinafter, a semiconductor element of the semiconductor chip 9 is made of silicon carbide (SiC) having high voltage resistance, low on-resistance, and high thermal resistance, however, the configuration is not limited thereto. For example, the semiconductor element of the semiconductor chip 9 may include a wide band gap semiconductor made of gallium nitride (GaN) instead of SiC or may also be made of silicon (Si).

The electrode 2 is made of a metal, and has a shape being folded at a plurality of portions. One end of the electrode 2 is fixed to the insulating substrate 1 of the semiconductor chip 9 by soldering, for example, and is electrically connected to the semiconductor chip 9 disposed on the insulating substrate 1. The electrode 2 stands upright on the insulating substrate 1.

The case 3 covers the one end of the electrode 2. The electrode 2 passes through the case 3, and the other end of the electrode 2 is located on an outer side of the case 3.

The nut 4 is embedded near a through hole through which the electrode 2 passes in an upper side of the case 3. The electrode 2 is folded so that the other end of the electrode 2 is located parallel with the upper surface of the case 3 and is located above the nut 4.

The nut 4 is used as an external connection part 4a engaged (screwed) together with the other end of the electrode 2 (a connection part) by a bolt (not shown) for being connected to an external wiring (not shown). The bolt for connection connects the electrode 2 and the external wiring as described above, thus the semiconductor chip 9 in the case 3 is electrically connected to the external wiring via the electrode 2.

At this time, a certain accuracy is required for a position, a positional relationship, and a size of the electrode 2, the through hole of the electrode 2 in the case 3, and the nut 4, for example, to achieve such a connection. As a result, such a configuration has a problem that an electrode structure becomes complex, thus a cost for the electrode 2 increases. A defect due to a breakage of the case, for example, occurs in some cases in a process of folding the electrode 2 after assembling the case 3, for example, so that the configuration described above has a problem that a yield and a manufacturing cost degrade. The accuracy in an alignment is required in assembling, so that the configuration described above has a problem that a result and an operation time depend on proficiency of an operator. In contrast, according to the power semiconductor device according to the present embodiment 1 described hereinafter, such problems can be solved.

FIG. 2 is a cross-sectional view illustrating a configuration of the power semiconductor device according to the present embodiment 1. The same reference numerals as those described in the related semiconductor device will be assigned to the same or similar constituent element in the power semiconductor device according to the present embodiment 1, and the different constituent elements are mainly described hereinafter.

The power semiconductor device in FIG. 2 includes the insulating substrate 1 which is the substrate with the semiconductor chip 9 thereon, the electrode 2, the insulating case 3, the nut 4, and a stud bolt 5.

The electrode 2 (FIG. 2) according to the present embodiment 1 is fixed to the insulating substrate 1 at one end thereof, and stands upright on the insulating substrate 1 in a manner similar to the electrode 2 of the related semiconductor device (FIG. 1). However, the electrode 2 (FIG. 2) according to the present embodiment 1 has folded portions smaller in number than the electrode 2 (FIG. 1) of the related semiconductor device, thereby relatively having simple shape and structure.

The case 3 does not have the through hole through which the electrode 2 passes, but houses the electrode 2. The case 3 has a part opposed to the other end of the electrode 2. The nut 4 has conductivity, and is inserted into the ease 3 at the part opposed to the other end of the electrode 2 in the case 3. In the present embodiment 1, the nut 4 protrudes from an outer surface of the case 3, and protrudes from an inner surface of the case 3.

The stud bolt 5 is a conductive component to electrically connect the other end of the electrode 2 and the nut 4. One end of the stud bolt 5 is connected (screwed) to the other end of the electrode 2, and the other end of the stud bolt 5 is engaged with (screwed to) the nut 4 halfway. Assumed as a method of achieving the above configuration is a method that the nut 4 is inserted into the case 3 to be rotatable to some extent with respect to the case 3 and then, the nut 4 is rotated to fasten (screw) the stud bolt 5, for example. Also assumed as a method of achieving the above configuration is a method that the case is molded after fastening (screwing) the stud bolt 5, for example. However, the other method may also be applied to achieve the above configuration.

A remaining part of the nut 4 other than a part which the stud bolt 5 (an upper part in FIG. 2) is engaged with (screwed to) is used as the external connection part 4a. The bolt (not shown) for being connected to the external wiring (not shown) is engaged with (screwed to) the external connection part 4a. The semiconductor chip 9 in the case 3 is thereby electrically connected to the external wiring via the electrode 2, the stud bolt 5, and the nut 4.

Conclusion of Embodiment 1

According to the present embodiment 1 described above, the electrode 2 and the nut 4 are electrically connected by the stud bolt 5. Since the processing of folding the other end of the electrode in manufacturing the related semiconductor device is not thereby needed, flexibility can be put into positions, positional relationships, and sizes of the electrode 2 and the nut 4. As a result, a reduction in cost and an enhancement of assembly of the electrode 2 can be expected. The folding process in the end of the electrode is omitted, thus a defect due to a breakage of the case, for example, can be reduced.

According to the present embodiment 1, the one end of the stud bolt 5 is connected to the other end of the electrode 2, and the other end of the stud bolt 5 is engaged with (screwed to) the nut 4 halfway. Thus, the nut 4 can also have the function of the external connection part 4a which the bolt for being connected to the external wiring can be engage with (screwed to).

According to the present embodiment 1, the nut 4 protrudes from the outer surface of the case 3 and protrudes from the inner surface of the case 3. Thus, even when the stud bolt 5 is short in length, reliability in engaging (screwing) the stud bolt 5 with to) the nut 4 can be increased. A connection defect between the external wiring and the nut 4 and thus a disconnection can be reduced.

Embodiment 2

FIG. 3 is a cross-sectional view illustrating a configuration of a power semiconductor device according to the embodiment 2 of the present invention. The same reference numerals as those described in the embodiment 1 will be assigned to the same or similar constituent element in the power semiconductor device according to the present embodiment 2, and the different constituent elements are mainly described hereinafter.

The power semiconductor device according to the present embodiment 2 has a bolt 6 instead of the stud bolt 5 as a conductive component to electrically connect the electrode 2 and the nut 4. One end (a head) of the bolt 6 is connected to the other end of the electrode 2, and the other end of the bolt 6 is engaged with (screwed to) the nut 4 halfway.

Conclusion of Embodiment 2

According to the present embodiment 2 described above, the effect similar to that of the embodiment 1 can be obtained. Since a junction part can be enhanced by using the bolt 6, the reliability of the power semiconductor device can be increased.

Embodiment 3

Figure 4:
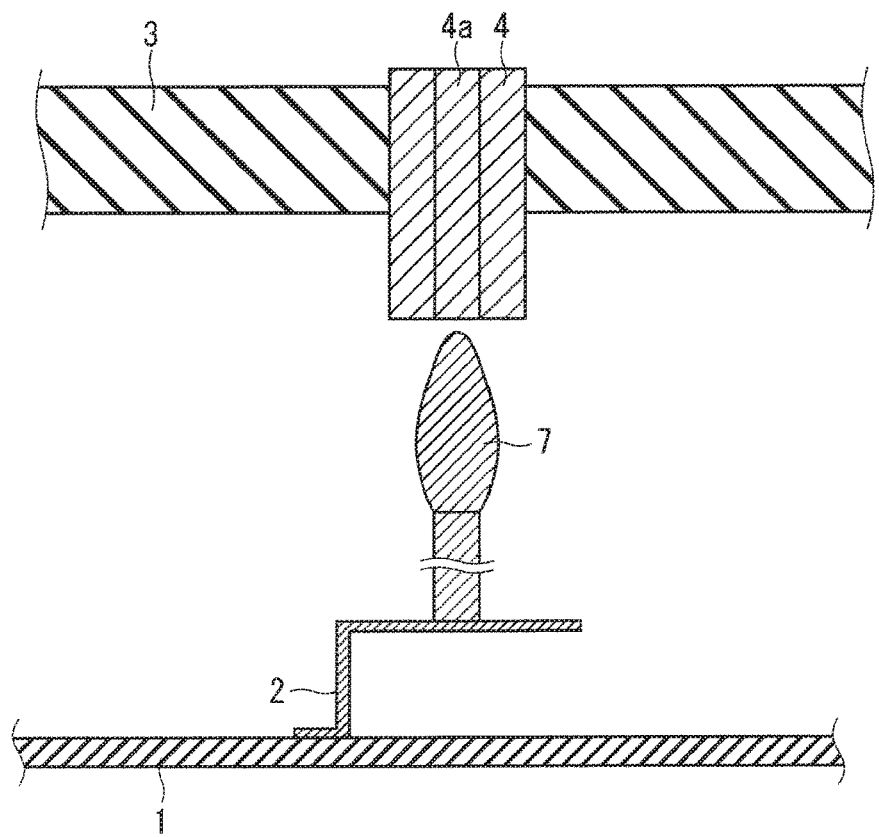
[FIG. 4] A cross-sectional view illustrating a configuration of a power semiconductor device according to an embodiment 3.
Figure 5:
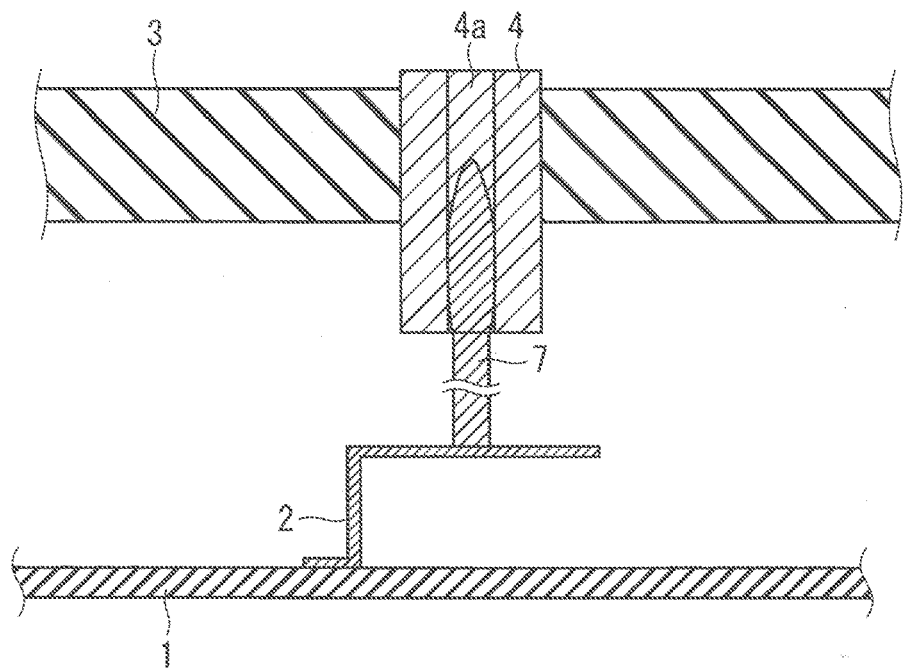
[FIG. 5] A cross-sectional view illustrating a configuration of the power semiconductor device according to the embodiment 3.

FIG. 4 and FIG. 5 are cross-sectional views each illustrating a configuration of a power semiconductor device according to the embodiment 3 of the present invention. The same reference numerals as those described in the embodiment 1 will be assigned to the same or similar constituent element in the power semiconductor device according to the present embodiment 3, and the different constituent elements are mainly described hereinafter.

The power semiconductor device according to resent embodiment 3 has a banana plug 7 instead of the stud bolt 5 as a conductive component to electrically connect the electrode 2 and the nut 4. One end of the banana plug 7 is connected to the other end of the electrode 2, and the other end of the banana plug 7 is engaged with (screwed to) the nut 4 halfway. FIG. 4 illustrates a state before the banana plug 7 is engaged (fitted), and FIG. 5 illustrates a state after the banana plug 7 is engaged (fitted).

Conclusion of Embodiment 3

According to the present embodiment 3 described above, the effect similar to that of the embodiment 1 can be obtained. Since the banana plug 7 eliminates the need for fastening, assemblability can be enhanced. The reduction in a total number of components can also be expected.

Embodiment 4

Figure 6:
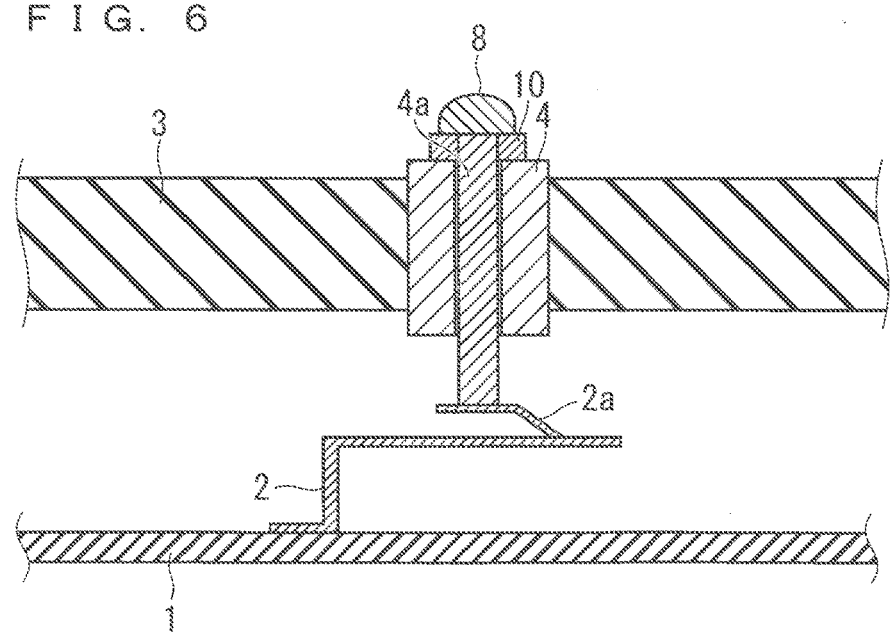
[FIG. 6] A cross-sectional view illustrating a configuration of a power semiconductor device according to an embodiment 4.

FIG. 6 is a cross-sectional view illustrating a configuration of a power semiconductor device according to the embodiment 4 of the present invention. The same reference numerals as those described in the embodiment 1 will be assigned to the same or similar constituent element in the power semiconductor device according to the present embodiment 4, and the different constituent elements are mainly described hereinafter.

The power semiconductor device according to the present embodiment 4 has a bolt 8 for being connected to the external wiring 10 instead of the stud bolt 5 as a conductive component to electrically connect the electrode 2 and the nut 4. A head of the bolt 8 is disposed on an outer side of the case 3, a middle portion of the bolt 8 is inserted into the nut 4, and a screw point of the bolt 8 is connected to the other end of the electrode 2.

A spring 2a which is an elastic portion is provided on the other end of the electrode 2 according to the present embodiment 4. Then, the screw point of the bolt 8 is connected to the spring 2a of the electrode 2.

Conclusion of Embodiment 4

According to the present embodiment 4 described above, the effect similar to that of the embodiment 1 can be obtained. Since the bolt 8 for being connected to the external wiring 10 is inserted into the nut 4, the number of components can be reduced.

According to the present embodiment 4, the screw point of the bolt 8 is connected to the spring 2a provided on the other end of the electrode 2. Thus, even when the bolt 8 is screwed too much, a damage of the electrode 2 can be reduced.

According to the present invention, the above embodiments can be arbitrarily combined, or each embodiment can be appropriately varied or omitted within the scope of the invention.

The present invention has been shown and described in detail, the foregoing description is in all aspects illustrative and not restrictive. It is therefore understood that numerous modifications and variations can be devised without departing from the scope of the invention.

EXPLANATION OF REFERENCE SIGNS

1 insulating substrate, 2 electrode, 2a spring, 3 case, 4 nut, 5 stud bolt, 6, 8, bolt, 7 banana plug, 9 semiconductor chip, 10 external wiring

The invention claimed is:

1. A power semiconductor device, comprising:
a substrate on which a semiconductor chip is disposed;
an electrode which has one end fixed to the substrate and stands upright on the substrate;
an insulating case which houses the electrode and has a part opposed to another end of the electrode;
a conductive nut which is inserted into the case in the part of the case; and
a conductive component which directly connects the another end of the electrode and the nut, wherein
the conductive component connects to the another end of the electrode at a position on an inner-surface side of the insulating case.

2. A power semiconductor device, comprising:
a substrate on which a semiconductor chip is disposed;
an electrode which has one end fixed to the substrate and stands upright on the substrate;
an insulating case which houses the electrode and has a part opposed to another end of the electrode;
a conductive nut which is inserted into the case in the part of the case; and
a conductive component which electrically connects the another end of the electrode and the nut, wherein
one end of the conductive component is connected to the another end of the electrode, and
another end of the conductive component is attached to the nut only partway.

3. The power semiconductor device according to claim 2, wherein
the conductive component includes a stud bolt, a bolt, or a banana plug.

4. The power semiconductor device according to claim 1, wherein
the conductive component includes a bolt for being connected to an external wiring, in which a head is disposed on an outer side of the case, a middle portion is inserted into the nut, and a screw point is connected to the another end of the electrode.

5. The power semiconductor device according to claim 4, wherein
an elastic portion is provided on the another end of the electrode, and
the screw point of the bolt is connected to the elastic portion of the electrode.

6. A power semiconductor device, comprising:
a substrate on which a semiconductor chip is disposed;
an electrode which has one end fixed to the substrate and stands upright on the substrate;
an insulating case which houses the electrode and has a part opposed to another end of the electrode;
a conductive nut which is inserted into the case in the part of the case; and
a conductive component which electrically connects the another end of the electrode and the nut, wherein
the nut protrudes from an outer surface of the case, and protrudes through an inner surface of the case.

7. The power semiconductor device according to claim 1, wherein
the semiconductor chip is made of silicon carbide.

* * * * *